(12) United States Patent
Lee et al.

(10) Patent No.: US 10,241,723 B2
(45) Date of Patent: Mar. 26, 2019

(54) MEMORY CARDS AND STORAGE SYSTEMS INCLUDING THE SAME

(71) Applicant: SAMSUNG ELECTRONICS CO., LTD., Suwon-si, Gyeonggi-do (KR)

(72) Inventors: In-Jae Lee, Hwaseong-si (KR); Kwang-Soo Kim, Hwaseong-si (KR); Hyong-Woo Yu, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/652,811

(22) Filed: Jul. 18, 2017

(65) Prior Publication Data

US 2018/0088865 A1    Mar. 29, 2018

(30) Foreign Application Priority Data

Sep. 29, 2016    (KR) .................. 10-2016-0125247

(51) Int. Cl.
*G11C 5/14* (2006.01)
*G06F 3/06* (2006.01)
*G06K 19/077* (2006.01)
*G11C 16/30* (2006.01)
*G06F 13/16* (2006.01)
*G06K 19/07* (2006.01)
*G11C 7/10* (2006.01)
*G11C 7/22* (2006.01)

(52) U.S. Cl.
CPC .......... *G06F 3/0659* (2013.01); *G06F 3/0604* (2013.01); *G06F 3/0679* (2013.01); *G06F 13/16* (2013.01); *G06K 19/0712* (2013.01); *G06K 19/07732* (2013.01); *G06K 19/07743* (2013.01); *G11C 16/30* (2013.01); *G11C 7/1042* (2013.01); *G11C 7/22* (2013.01); *G11C 2207/2209* (2013.01)

(58) Field of Classification Search
CPC ..... G06F 3/0659; G06F 3/0679; G06F 3/0604
See application file for complete search history.

(56) References Cited

U.S. PATENT DOCUMENTS 7,364,468 B2    4/2008    Liu et al.
7,679,133 B2    3/2010    Son et al.
(Continued)

FOREIGN PATENT DOCUMENTS

KR    10-0725981    6/2007

*Primary Examiner* — Mohammed A Bashar
(74) *Attorney, Agent, or Firm* — Lee & Morse P.C.

(57) ABSTRACT

A memory card includes first and second groups of terminals, at least one controller, and first and second nonvolatile memories. The first group of terminals are adjacent to an edge at an insertion side of a substrate and include a first power terminal to provide a first voltage. The second group of terminals is spaced farther apart from the edge at the insertion side than the first group of terminals and includes a second power terminal to provide a second voltage. The at least one memory controller is connected to the first and second groups of terminals, and the first and second nonvolatile memories are independently connected to the at least one controller. The at least one controller simultaneously accesses the first nonvolatile memory and the second nonvolatile memory when the first group of terminals and the second group of terminals are connected to an external host.

19 Claims, 17 Drawing Sheets

(56) References Cited

U.S. PATENT DOCUMENTS

| | | |
|---|---|---|
| 7,822,883 B2 | 10/2010 | Miller et al. |
| 7,834,276 B2 | 11/2010 | Chou et al. |
| 7,970,982 B2 | 6/2011 | Kim et al. |
| 7,987,308 B2 | 7/2011 | Jo et al. |
| 8,553,466 B2 | 10/2013 | Han et al. |
| 8,559,235 B2 | 10/2013 | Yoon et al. |
| 8,654,587 B2 | 2/2014 | Yoon et al. |
| 2005/0182858 A1 | 8/2005 | Lo et al. |
| 2007/0283053 A1 | 12/2007 | Liu et al. |
| 2011/0233648 A1 | 9/2011 | Seol et al. |
| 2013/0012049 A1 | 1/2013 | Pinto et al. |
| 2014/0063943 A1* | 3/2014 | Nagashima ............ G11C 16/30 365/185.08 |
| 2016/0049742 A1* | 2/2016 | Han ....................... G11C 16/30 365/185.18 |

* cited by examiner

MEMORY CARDS AND STORAGE SYSTEMS INCLUDING THE SAME

CROSS-REFERENCE TO RELATED APPLICATION

Korean Patent Application No. 10-2016-0125247, filed on Sep. 29, 2016, and entitled, "Memory Cards and Storage Systems Including the Same," is incorporated by reference herein in its entirety.

BACKGROUND

1. Field

One or more embodiments described herein relate memory cards and storage systems including memory cards.

2. Description of the Related Art

A memory device may be fabricated from various semiconductor materials. Examples include silicon, germanium, gallium arsenide, and indium phosphide. Some memory devices are volatile memory devices, while others are nonvolatile memory devices. The volatile memory devices may lose stored contents when powered off. Examples of volatile memory devices include a static random access memory, a dynamic RAM, and a synchronous DRAM. Nonvolatile memory devices retain stored contents when powered off. Examples include a read only memory, a programmable ROM, an electrically programmable ROM, an electrically erasable and programmable ROM, a flash memory device, a phase-change RAM, a magnetoresistive RAM, a resistive RAM, and a ferroelectric RAM.

A nonvolatile memory may be used as storage for a computing device. For example, a nonvolatile memory may be used to form a solid state drive (SSD) for a computer, embedded storage for a mobile device, and a detachable memory card detachable from a computer or a mobile device.

SUMMARY

In accordance with one or more embodiments, a memory card includes a substrate including two pairs of edges, the edges in each pair arranged opposite to each other; a first group of terminals adjacent to an edge at an insertion side of the substrate, the first group of terminals including a first power terminal to provide a first voltage; a second group of terminals spaced farther apart from the edge at the insertion side than the first group of terminals, the second group of terminals including a second power terminal to provide a second voltage; at least one memory controller connected to the first group of terminals and the second group of terminals; at least a first nonvolatile memory connected to the at least one memory controller; and at least a second nonvolatile memory connected to the at least one memory controller independently from the first nonvolatile memory, wherein the at least one memory controller is to simultaneously access the first nonvolatile memory and the second nonvolatile memory when the first group of terminals and the second group of terminals are connected to an external host.

In accordance with one or more other embodiments, a storage system includes a host; a socket electrically connected to the host; and a memory card to be inserted into the socket and including: a substrate having two pairs of edges, the edges in each pair are arranged opposite to each other; a first group of terminals adjacent to an edge at an insertion side of the substrate, the first group of terminals including a first power terminal to provide a first voltage; a second group of terminals spaced farther apart from the edge at the insertion side than the first group of terminals, the second group of terminals including a second power terminal to provide a second voltage; at least one memory controller connected to the first group of terminals and the second group of terminals; at least a first nonvolatile memory connected to the at least one memory controller; and at least a second nonvolatile memory connected to the at least one memory controller independently from the first nonvolatile memory, wherein the at least one memory controller is to simultaneously access the first nonvolatile memory and the second nonvolatile memory when the first group of terminals and the second group of terminals are connected to the host.

In accordance with one or more other embodiments, a memory card includes a plurality of connections; and at least one controller to simultaneously access a first nonvolatile memory and a second nonvolatile memory when first terminals and second terminals on the memory card are coupled to a host, wherein the first nonvolatile memory and the second nonvolatile memory are independently coupled to the at least one controller through the connections.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
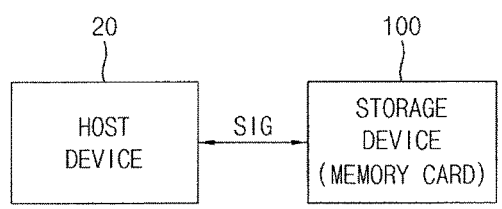
FIG. 1 illustrates an embodiment of a storage system.

FIG. 1 illustrates an embodiment of a storage system 10 which may include a host device 20 and a storage device (or, a memory card) 100. The storage system 10 may be, for example, a data storage system. The host device 20 communicates with the storage device 100 and transmits and/or receives a signal SIG to and/or from the storage device 100.

The host device 20 may apply control signals to the storage device 100 and receive data from the storage device 100.

The storage device 100 communicates with the host device 20 to conduct an operation based on control of the host device 20. The storage device 100 may include one or more nonvolatile memories, e.g., flash memories, PRAMs, MRAM, and/or RRAMs. In exemplary embodiments, the storage device 100 may be a detachable memory card which is connected to or detached from the host device 20. When the storage device 100 is a detachable memory card, the storage device 100 may be, for example, a hybrid memory card which communicates with the host device based on at least two protocols. The host device 20 may support various protocols conforming, for example, to various card interfaces.

Figure 2:
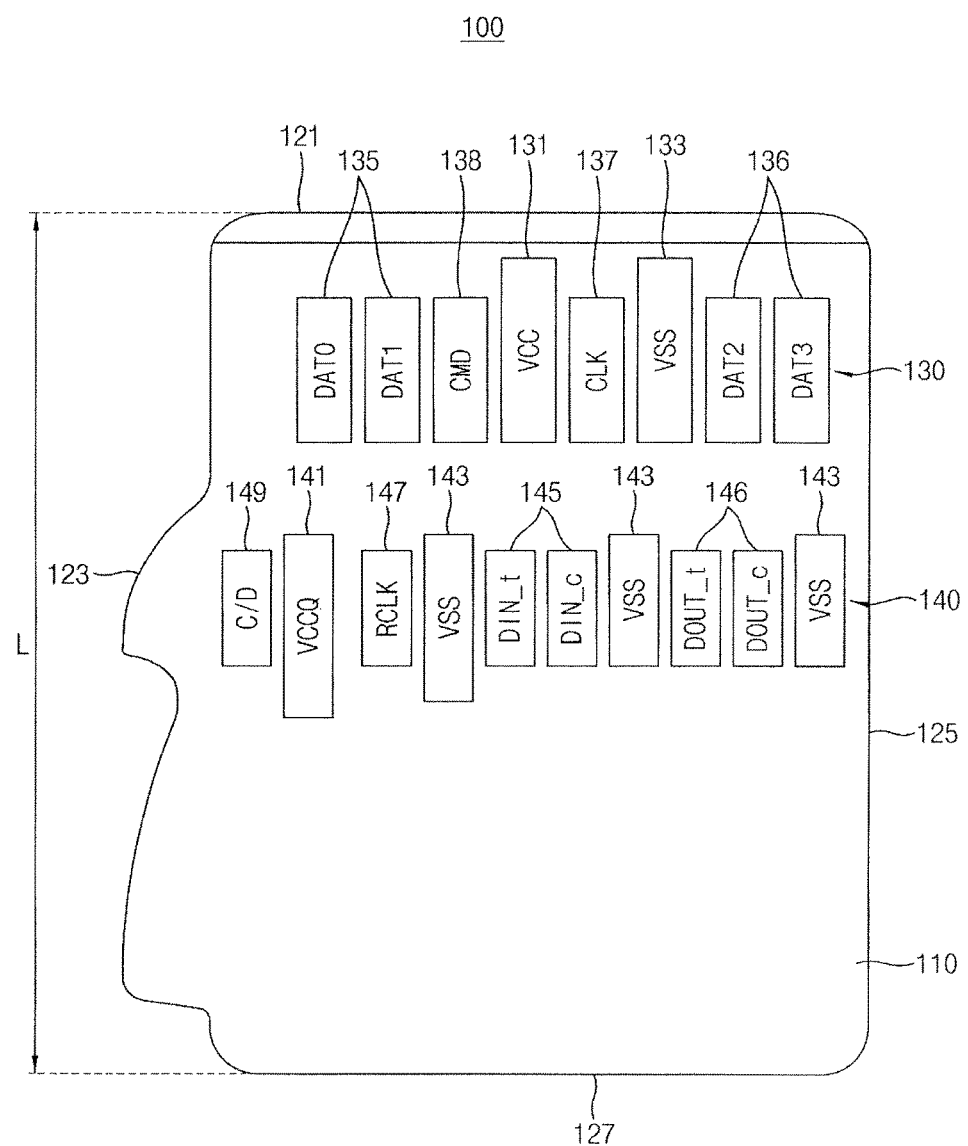
FIG. 2 illustrates an embodiment of a memory card.

FIG. 2 illustrates an embodiment of the memory card 100 which may have two pairs of edges, with the edges of each pair arranged opposite to each other. The edges may include an edge 121 (e.g., an insertion edge) at an insertion side where the memory card 100 is inserted into a socket, a first edge 123 and a second edge 125 that adjoin the edge 121 at the insertion side, and a third edge 127 opposite the edge 121 at the insertion side. The insertion edge 121 and the third edge 127 may therefore provide one of the two pairs of edges, and the first edge 123 and second edge 125 may form the other. The edge 121 at the insertion side and the third edge 127 may be substantially parallel to each other. A first direction refers herein to a direction substantially perpendicular to the edge 121 at the insertion side.

In addition, a substrate 110 of the memory card 100 may include a first group of terminals 130 adjacent to the insertion edge 121 and a second group of terminals 140 spaced apart from the first group of terminals 130 farther from the insertion edge 121.

The first group of terminals 130 may include a first power terminal (VCC) 131 to supply a first voltage, first data terminals 135 and 136, at least one ground terminal 133, a clock terminal 137 and a command terminal 136. The first data terminals 135 and 136 may include a pair of first data input terminals 135 to receive data and a pair of first data output terminals 136 to output data.

The second group of terminals 140 may include a second power terminal (VCCQ) 141 to supply a second voltage, second data terminals 145 and 146, a reference clock terminal 147, a card detection terminal 149, and at least one ground terminal 143. The second data terminals 145 and 146 may include a pair of second data input terminals 145 to receive data and a pair of second data output terminals 146 to output data.

The first group of terminals 130 includes the first power terminal 131 to supply the first voltage. The first voltage may be, for example, approximately between about 3.0 V and about 3.5 V. The first voltage may be supplied to semiconductor devices that operate at a low speed among semiconductor devices in the memory card 100. For example, the first voltage may be supplied to at least one volatile memory device in the memory card 100.

The second group of terminals 140 includes the second power terminal 141 to supply the second voltage. The second voltage may be, for example, approximately between about 1.5 V and about 2.2 V. The second voltage may be supplied to semiconductor devices that operate at a high speed among semiconductor devices in the memory card 100. For example, the second voltage may be supplied to at least one memory controller in the memory card 100.

Because the first group of terminals 130 are closer to the edge 121 at the insertion side than are the second group of terminals 140, power may be supplied to the first group of terminals 130 before being supplied to the second group of terminals 140 when the memory card 100 is inserted. For example, as the memory card 100 is inserted, power of the first voltage may be supplied to the non-volatile memory device before the card is fully inserted via the first power terminal 131 in the first group of terminals 130.

Accordingly, the first group terminals 130 may also be provided with at least one ground terminal, and a first ground terminal 133 may also be connected to a host device during insertion (along with the first power terminal 131) to form a complete power and ground circuit. By including a ground terminal 133 along with the first power terminal 131, the entire memory card 100 may be operated during insertion of the memory card 100, before power is supplied to the memory controller, so that overall operation of the memory card 100 may be prepared.

In one embodiment, the distance between a front end of the first power terminal 131 and the insertion edge 121 may be substantially the same as the distance between a front end of the first ground terminal 133 and the insertion edge 121. The length of the first power terminal 131 in the first direction may be substantially the same as the length of the first ground terminal 133 in the first direction.

In exemplary embodiments, a front end may refer to the one of the two ends of an element that is closer to the insertion edge 121 than the other. A rear end may refer to the one of the two ends of an element farther from the insertion edge 121 than the other.

The distance between the front end of the first voltage power terminal 131 and the insertion edge 121 (and between the front end of the first ground terminal 133 and the insertion edge 121) may be less than the distance between front ends of the first data input terminals 135 and first data output terminals 136 and the insertion edge 121. When the memory card 100 is inserted into a socket, the entire memory card 100 may be driven prior to signal transmission with respect to a host, by allowing each of the first voltage power terminal 131 and the first ground terminal 133 to contact a socket pin before other terminals of the first row terminals 130 (such as the first data input terminals 135 and the first data output terminals 136) contact socket pins.

The first data input terminals 135 and the first data output terminals 136 may be spaced apart from each other, with a ground terminal therebetween. This may prevent signal interference that otherwise may result from noise between the first data input terminals 135 and the first data output terminals 136.

One pair of first data input terminals 135 may have substantially identical dimensions, and one pair of first data output terminals 136 may have substantially identical dimensions. In addition, the first data input terminals 135 and the first data output terminals 136 may have substantially identical dimensions. The length of the first data input terminals 135 and the first data output terminals 135 in the first direction may be less than the length of the first ground terminal 133 in the first direction.

The front end of the first ground terminal 133 may be closer to the edge 121 at the insertion side than the front ends of the first data input terminals 135 and the first data output terminals 136. The distance between a rear end of the first ground terminal 133 and the edge 121 at the insertion side may be greater than or equal to the distance between rear ends of the first data input terminals 135 and the first data output terminals 136 and the edge 121 at the insertion side.

Furthermore, the location range of the first data input terminals 135 and the first data output terminals 136 in the first direction may be within the location range of the first ground terminal 133 in the first direction. The first data input terminals 135 and the first data output terminals 136 may be spaced apart from each other, with the first power terminal 131 and the first ground terminal 133 therebetween.

The second group of terminals 140 may be in or near a central portion of the memory card 100. The distance between the second row terminals 140 and the memory controller and the distance between the second group of terminals 140 and the nonvolatile memory device may thereby be reduced and routing may be simplified. Thus, a high operational speed may be achieved and a circuit design may be more easily facilitated. For example, when the second group of terminals 140 are in or near the central portion of the memory card 100, routing may be readily provided using a via hole passing through first and second surfaces of the substrate 110 in a region between the second group of terminals 140 and the third edge 127. As a result, manufacturing time and costs may be reduced.

In one embodiment, power supplied to a semiconductor device operating at a high speed may be supplied to the memory controller via the second power terminal 141. Because the second row terminals 140 (which include the second power terminal 141) are in or near the central portion of the memory card 100, a path may be reduced through which power is supplied to the memory controller 192. As a result, high-speed operation may be possible. Regardless of which portion of the memory card 100 the memory controller is disposed, a relatively small distance between the memory controller and the second power terminal 141 may be maintained which may facilitate convenience in terms of design.

For example, the distance in the first direction between a center of the second group of terminals 140 and a center of the memory card 100 may be approximately about 20% or less of a length L of the memory card 100 in the first direction. The second group of terminals 140 may have various lengths in the first direction. Moreover, positions of the front ends and the rear ends of the respective terminals may not be regular. The center of the second row terminals 140 may be defined by a center of a terminal, among the second data input terminals 145 and the second data output terminals 146, closest to the edge 121 at the insertion side.

Therefore, regardless of the location of the memory controller and the nonvolatile memory devices, the distance between the memory controller and the nonvolatile memory devices and the second data input terminals 145 and the second data output terminals 146 may be reduced or minimized. This may allow for high-speed operation and may provide a degree of freedom in terms of design.

A pair of second data input terminals 145 may have substantially identical dimensions, and a pair of second data output terminals 146 may have substantially identical dimensions. In addition, the second data input terminals 145 and the second data output terminals 146 may have substantially identical dimensions. The length in the first direction of the second data input terminals 145 and the second data output terminals 146 may be less than the length in the first direction of ground terminals 143 in a second row.

Front ends of the ground terminals 143 in the second row may be closer to the edge 121 at the insertion side than the front ends of the second data input terminals 145 and the second data output terminals 146. The distance between rear ends of the ground terminals 143 in the second row and the edge 121 at the insertion side may be greater than or equal to the distance between the rear ends of the second data input terminals 145 and the second data output terminals 146 and the edge 121 at the insertion side.

Furthermore, the location range in the first direction of the second data input terminals 145 and the second data output terminals 146 may be within the location range in the first direction of the ground terminals 143 included in the second row. The second data input terminals 145 and the second data output terminals 146 may be spaced apart from each other, with ground terminals therebetween. The ground terminals may prevent signal noise between the second data input terminals 145 and the second data output terminals 146.

The second group of terminals 140 may include at least one ground terminal 143. The second data input terminals 145 may be between a pair of ground terminals 143 in order to be shielded. The second data output terminals 146 may also be between a pair of ground terminals 143 in order to be shielded. Each of the second data input terminals 145 and the second data output terminals 146 may therefore be shielded by a pair of ground terminals 143 to facilitate stable inputting or outputting of data.

In some embodiments, the second data input terminals 145 and the second data output terminals 146 may be spaced apart from each other, with a ground terminal therebetween. The second data input terminals 145 and second data output terminals 146 may be between a pair of ground terminals. Thus, the second data input terminals 145 are shielded by a pair of ground terminals and the second data output terminals 146 are shielded by a pair of ground terminals, and the second data input terminals 145 and the second data output terminals 146 may have a common ground terminal. In one embodiment, the second data input terminals 145 and the second data output terminals 146 may also be shielded without a common ground terminal therebetween.

An examples of ground terminals that may shield the second data input terminals 145 and the second data output terminals 146 include the card detection terminal 149, which is a grounded terminal.

Front ends of the second voltage power terminal 141 and the ground terminals 143 in the second group of terminals 140 may be closer to the insertion edge 121 than front ends of the second data input terminals 145 and the second data output terminals 146. When the memory card 100 is inserted into a socket, the second voltage power terminal 141 and the ground terminals 143 in the second row contact a socket pin before other terminals of the second row terminals 140 (such as the second data input terminals 145 and the second data output terminals 146). As a result, a power and ground circuit that drives the memory controller may be completed prior to signal transmission with respect to a host device.

The distance between the front end of the second power terminal 141 and the edge 121 at the insertion side may be substantially the same as the distance between the front ends of the ground terminals 143 in the second row and the edge 121 at the insertion side. The length in the first direction of the second power terminal 141 in the first direction may be substantially the same as the length of the ground terminals 143 in the second row.

The second group of terminals 140 may include the reference clock terminal 147. The distance between the reference clock terminal 147 and the memory controller may be reduced or minimized for high-speed operation. The position of the memory controller may be different, for example, according to the design of the memory card 100. Thus, the reference clock terminal 147 may be as close to the center of the memory card as possible. In this regard, the reference clock terminal 147 may be closer to the center of the memory card 100 than the card detection terminal 149 or the second power terminal 141.

In addition, the second group of terminals 140 may be spaced apart from the second data input terminals 145 and the second data output terminals 146, with a ground terminal therebetween. The reference clock terminal 147 may be spaced apart from the second data input terminals 145 and the second data output terminals 146, with a ground terminal therebetween. In this manner, the influence of noise caused by signal input and output may be reduced or minimized, thereby enabling more stable operation of the memory card 100.

The second group of terminals 140 may include the card detection terminal 149. The card detection terminal 149 may be adjacent to the second power terminal 141. In one embodiment, the card detection terminal 149 may be closest to the first edge 123 among the second group of terminals 140, and the second power terminal 141 may be along a lateral direction of the card detection terminal 149. Thus, positions of the card detection terminal 149 and the second power terminal 141 may be exchanged.

The card detection terminal 149 allows a host device to determine the type of memory card 100. The card detection terminal 149 may be a grounded terminal electrically connected to a ground line.

By using a grounded terminal as the card detection terminal 149 (rather than data input and output terminals) and by allowing a host device to receive a ground signal from a socket terminal at a position of the card detection terminal 149 to determine card type, the accuracy of recognition of card types may be remarkably increased. Accordingly, recognition error may be reduced. Moreover, a data input and output process for recognizing card type may be omitted, thereby increasing recognition speed.

The positions of the front end of the second power terminal 141 and the front end of the card detection terminal 149 may be different from each other. For example, as illustrated in FIG. 2, the front end of the second power terminal 141 may be closer to the insertion edge 121 than the front end of the card detection terminal 149.

When host socket pins for contacting the second group of terminals 140 are parallel to a horizontal direction (perpendicular to the first direction), the second power terminal 141 (having a front end closer to the insertion edge 121) contacts the socket pins before the card detection terminal 149 when the memory card 100 is inserted. As a result, power may be supplied to the memory controller in advance, and the memory card 100 may be operated in advance, before the host device recognizes a type of the memory card 100.

In some embodiments, no terminal may be between the front end of the card detection terminal 149 and the insertion edge 121. For example, none of the first group of terminals 130 are between the front end of the card detection terminal 149 and the insertion edge 121. Accordingly, when the memory card 100 is inserted, a socket pin corresponding to the card detection terminal 149 will not erroneously contact other terminals of the memory card 100. Thus, an error in which the host device recognizes the wrong type of card may be prevented. The substrate 110 of the memory card 100 may have a shape, for example, corresponding to a Universal Flash Storage (UFS) memory card standard.

Figure 3:
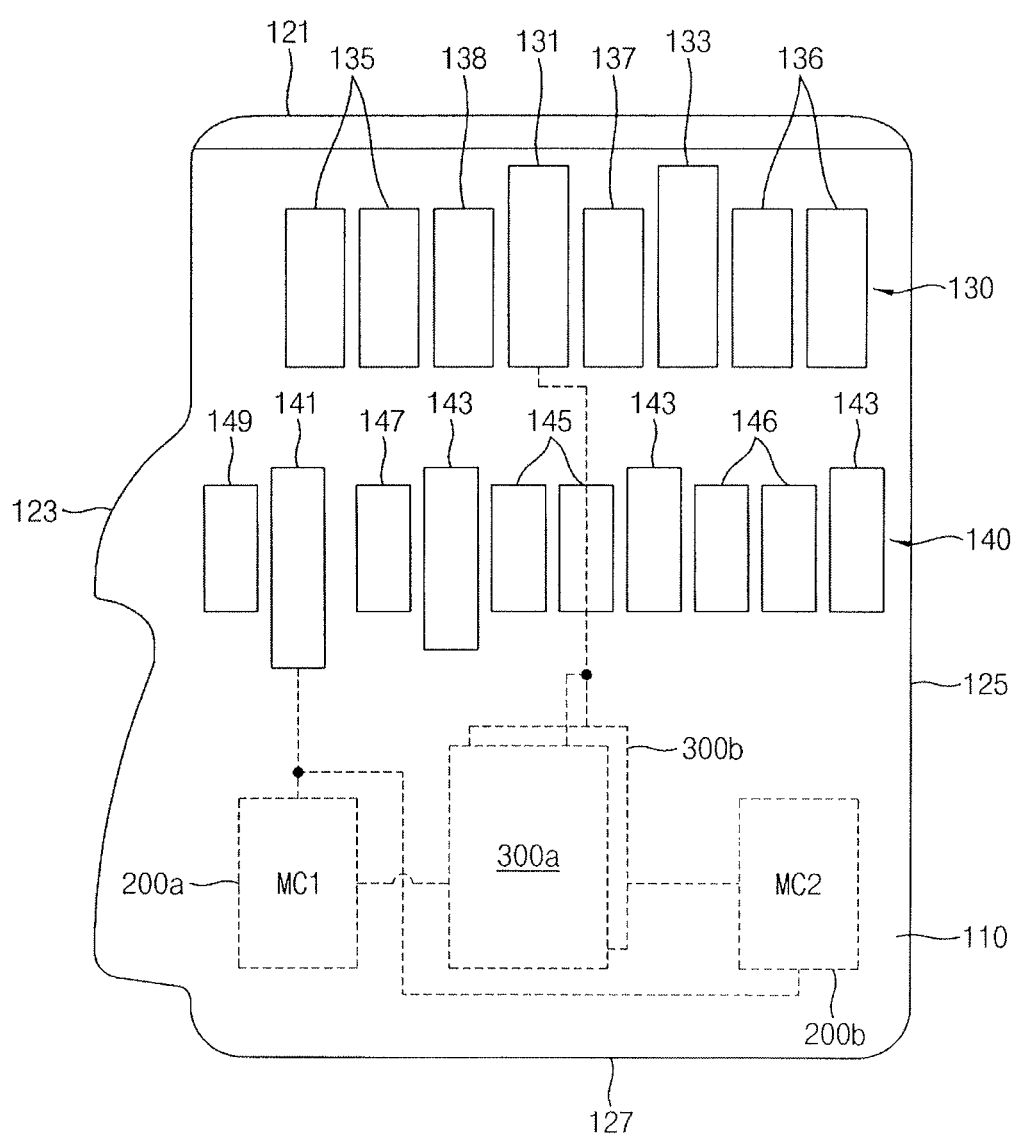
FIG. 3 illustrates another view of the memory card in FIG. 2.

FIG. 3 illustrates an embodiment of a memory card 100a and some internal components. Referring to FIG. 3, the memory card 100a may include a first memory controller 200a, a second memory controller 200b, a first nonvolatile memory device 300a, and a second nonvolatile memory device 300b. First nonvolatile memory device 300a and second nonvolatile memory device 300b may be in the memory card 100a. In one embodiment, memory card 100a may include two or more first nonvolatile memory devices 300a and two or more first nonvolatile memory devices 300b.

The first memory controller 200a and the second memory controller 200b may be connected to the second power terminal 141 and may be supplied with the second voltage. The first nonvolatile memory device 300a and the second nonvolatile memory device 300b may be connected to the first power terminal 131 and may be supply with the first power.

The first memory controller 200a may be connected to the second group of terminals 140 and may communicate with the host device 20 according to a first protocol to access the first nonvolatile memory device 300a. The second memory controller 200b may be connected to the first group of terminals 130 and may communicate with the host device 20 according to a second protocol to access the second nonvolatile memory device 300b.

The first protocol may be a Universal Flash Storage (UFS) protocol, and the second protocol may be a Secure Digital (SD) protocol. Access on the first nonvolatile memory device 300a by the first memory controller 200a and access on the second nonvolatile memory device 300b by the second memory controller 200b may be simultaneously performed. Therefore, when the memory card 100a is electrically connected to the host device 20 via a socket, the host device 20 may recognize that a UFS card and an SD card are simultaneously connected.

The first nonvolatile memory device 300a and the second nonvolatile memory device 300b may be the same kind of nonvolatile memory device or different kinds of nonvolatile memory devices. For example, the first nonvolatile memory device 300a and the second nonvolatile memory device 300b may be NAND flash memory. In one embodiment, the first nonvolatile memory device 300a may be a vertical NAND flash memory and the second nonvolatile memory device 300b may be a planar flash memory, or another kind of nonvolatile memory different from a flash memory.

In exemplary embodiments, operating system (OS) and application may run on the first nonvolatile memory device 300a and data may be stored in the second nonvolatile memory device 300b using secure function.

Figure 4:
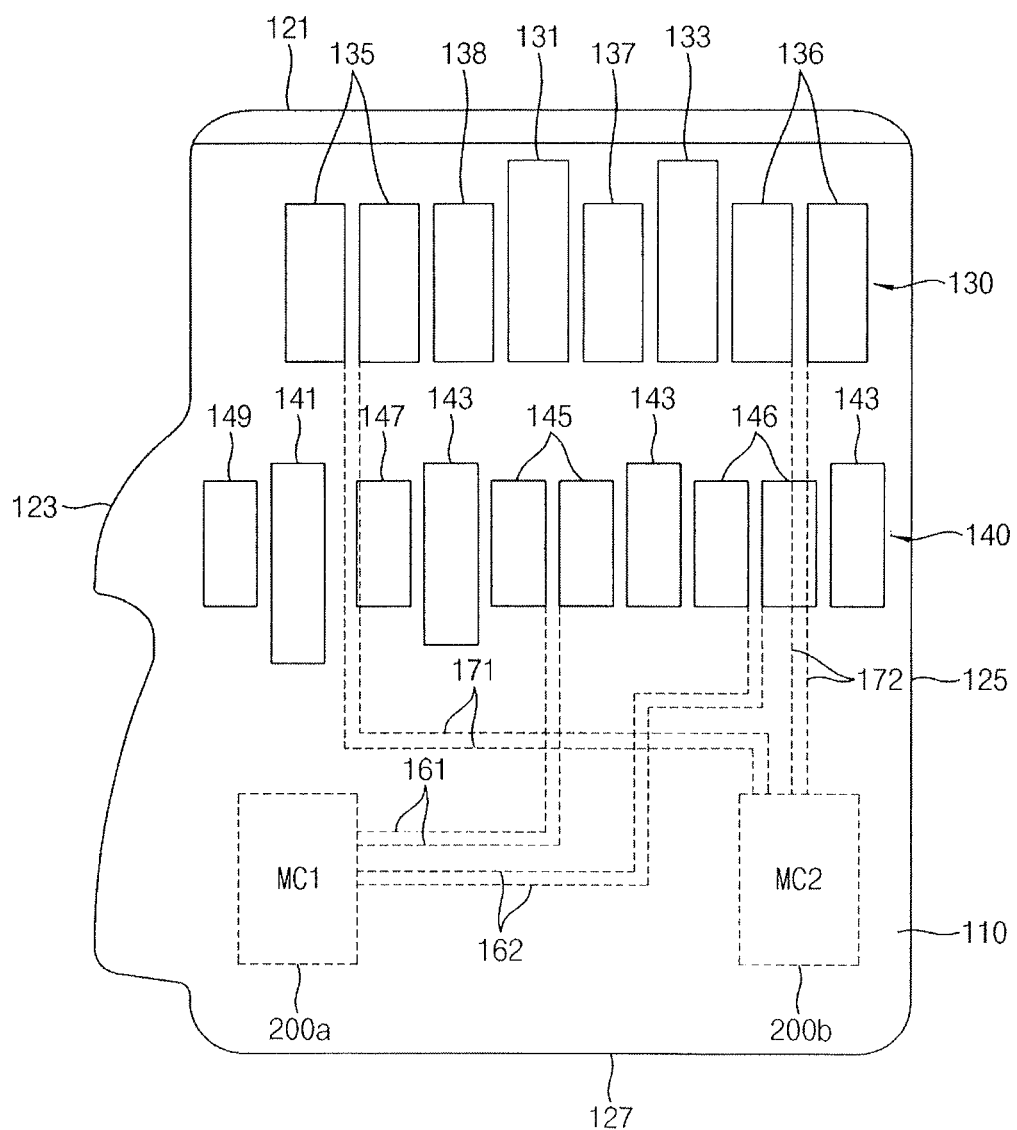
FIG. 4 illustrates an embodiment including memory controllers.

FIG. 4 illustrating an embodiment including a first memory controller and a second memory controller in the memory card in FIG. 3. Referring to FIG. 4, the first memory controller 200a may be connected to the second data input terminals 145 via a first signal path 161 through which data is received, and may be connected to the second data output terminals 146 via a second signal path 162 through which data is transmitted. The first memory controller 200a may transmit and/or receive the data to and/or from the host device 20 via the first and second signal paths 161 and 162.

The second memory controller 200b may be connected to the first data input terminals 135 via a first signal path 171 through which data is received, and may be connected to the second data output terminals 136 via a second signal path 172 through which data is transmitted. The second memory controller 200b may transmit and/or receive the data to/from the host device 20 via the first and second signal paths 171 and 172 simultaneously as the first memory controller 200a may transmit and/or receive the data to and/or from the host device 20 via the first and second signal paths 161 and 162.

The first and second signal paths 161 and 162 and the first and second signal paths 171 and 172 may be formed on a second surface of the substrate 110 and the second substrate may be opposed to a first surface of the substrate 110, on which the first group of terminals 130 and the second group of terminals 140 are formed.

Figure 5:
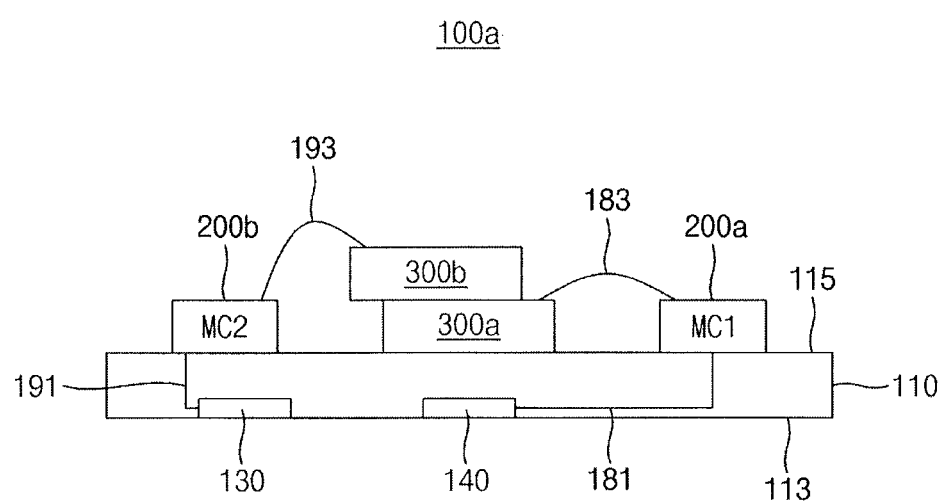
FIG. 5 illustrates another view of the memory card.

FIG. 5 illustrates a sectional view of the memory card in FIG. 3. Referring to FIG. 5, the first group of terminals 130 and the second group of terminals 140 may be on a first surface 113 of the substrate 110. The first memory controller 200a, the second memory controller 200b, the first nonvolatile memory device 300a, and the second nonvolatile memory device 300b may be on a second surface 115 of the substrate 110, which is opposite to the first surface 113. The positions, sizes, and/or correlation between these may be different in another embodiment.

The first memory controller 200a may be electrically connected to the second group of terminals 140 via a wire 181, wiring on the first and second surfaces 113 and 115 of the substrate 110, or a wiring layer or a through via inside the substrate 110. The first memory controller 200a may be electrically connected to the first nonvolatile memory device 300a via a wire 183.

The second memory controller 200b may be electrically connected to the first group of terminals 130 via a wire 191, wiring formed on the first and second surfaces 113 and 115 of the substrate 110, or a wiring layer or a through via inside the substrate 110. The second memory controller 200b may be electrically connected to the second nonvolatile memory device 300a via a wire 193.

Figure 6:
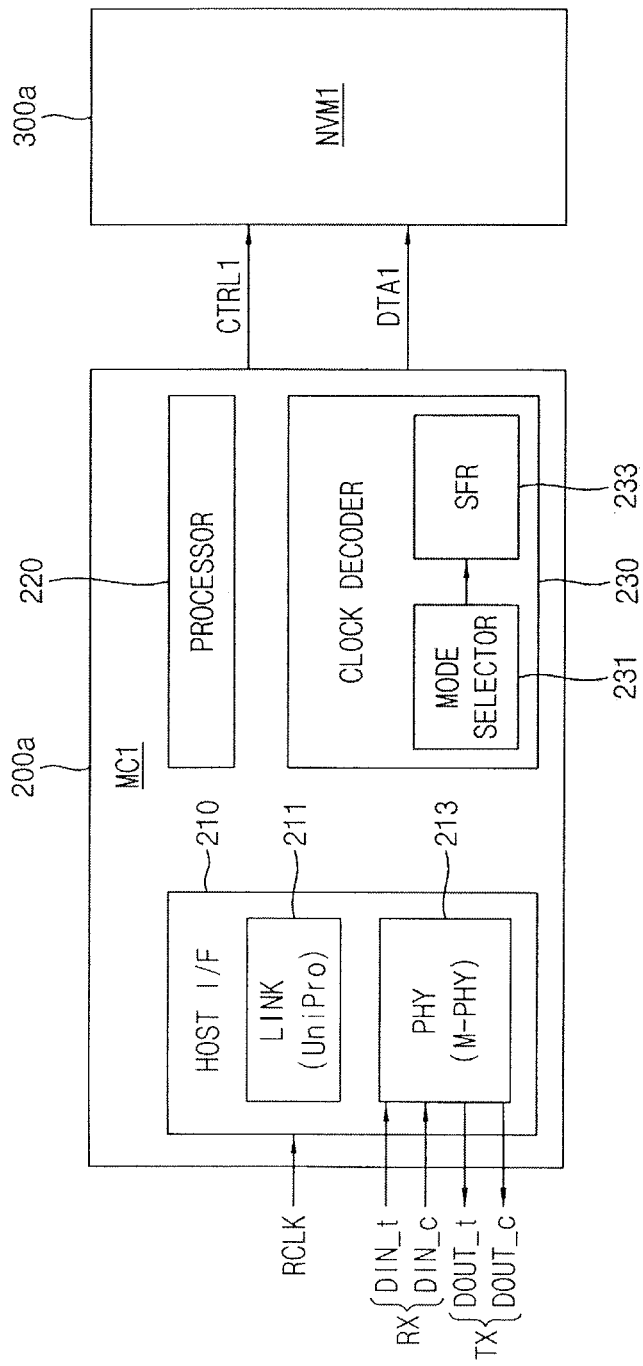
FIG. 6 illustrates an embodiment of a memory controller and a nonvolatile memory device.

FIG. 6 illustrates an embodiment of the first memory controller and the first nonvolatile memory device in the memory card of FIG. 3. Referring to FIG. 6, the first nonvolatile memory device 300a may perform a read, a write, and an erase operation based on control of the first memory controller 200a. The first memory controller 200a may control the first nonvolatile memory device 300a based on a request of the host device 20. The first memory controller 200a issues a first control signal CTRL1 to the first nonvolatile memory device 300a and exchanges first data DTA1 with the first nonvolatile memory device 300a.

The first memory controller 200a may include a first host interface 210, a clock decoder 230, and a processor 220. The first host interface 210 may manage communications between the first memory controller 200a and the host device 20 in compliance with the first protocol. The first protocol may be a UFS protocol. The first host interface 210 may interface with a host device supporting the same interface protocol through various interface protocols. Examples include Universal Serial Bus (USB), Multi-media Card (MMC), Peripheral Component Interconnect-Express (PCI-E), Serial Advanced Technology Attachment (SATA), Parallel Advanced Technology Attachment (PATA), Small Computer System Interface (SCSI), Enhanced Small Device Interface (ESDI), and Intelligent Drive Electronics (IDE).

The host interface 210 may include a link layer 211 and a physical layer 213. The link layer 211 may generate an output signal in compliance with the UFS protocol and may receive a reception signal. The link layer 211 may include the following of Open Systems Interconnection (OSI) layers: a physical adaptor layer L1.5, a data link layer part L2, a network layer L3, and a transport layer L4. The link layer 211 may form a Device Management Entity (DEM). The link layer 211 may include Mobile Industry Processor Interface (MIPI) Unipro.

The physical layer 213 may transmit an output signal in compliance with the UFS protocol and may receive a reception signal. The physical layer 233 may include a physical layer L1 of the OSI layers. The physical layer 213 may contain MIPI M-PHY.

The host interface 210 may include an output terminal TX, an input terminal RX, and a clock terminal RCLK. The physical layer 211 may transmit a signal to the host device 20 through the output terminal TX. The output terminal TX is connected to a reception pad of the host device 20 to form a channel. The output terminal TX may include a first output terminal DOUT_t and a second output terminal DOUT_c. The output terminal TX may be connected to the second data output terminals 146 of the second group of terminals 140.

The physical layer 213 receives a signal applied to the host device 20 through the input terminal RX. The input terminal RX is connected to an output terminal of the host device 20 to form a channel. The input terminal RX may include a first input terminal DIN_t and a second input terminal DIN_c. The first input terminal DIN_t and the second input terminal DIN_c. The input terminal RX may be connected to the second data input terminals 145 of the second group of terminals 140.

The clock decoder 230 may receive a reference clock signal from the host interface 210. The physical layer 213 transmits the reference clock signal to the clock decoder 230. The clock decoder 230 decodes the reference clock signal stores the decoded result. The clock decoder 230 may include a mode selector 231 and a special function register (SFR) 233. The mode selector 231 analyzes the reference clock signal by a segment. The reference clock signal includes a plurality of segments, each of which has information about one of a plurality of clock modes.

The SFR 233 may store clock mode information of each segment identified by the mode selector 231. Pieces of clock mode information of segments may constitute a command set.

The processor 220 may control an overall operation of the first memory controller 200a and may conduct a logical operation. The processor 220 may be implemented with firmware and a microprocessor chip. In some cases, the processor 220 may be implemented with firmware without the microprocessor chip.

Figure 7:
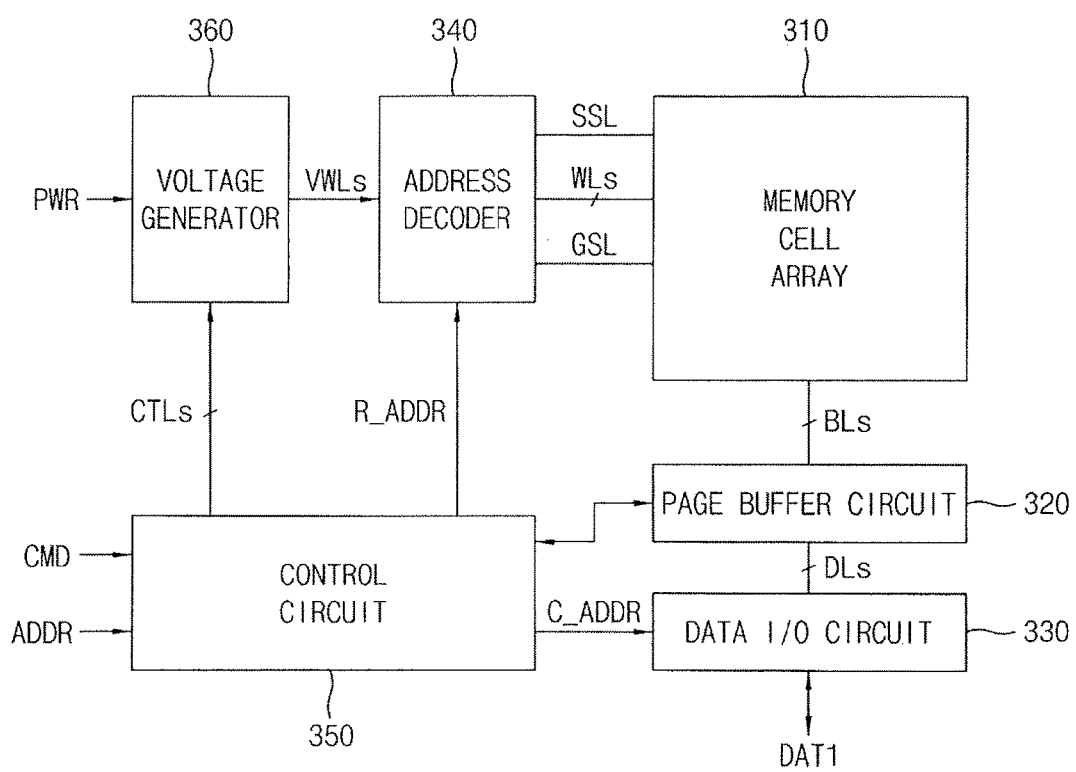
FIG. 7 illustrates an embodiment of a nonvolatile memory device.

FIG. 7 illustrates an embodiment of the first nonvolatile memory device 300a in the memory card of FIG. 3. Referring to FIG. 7, the first nonvolatile memory device 300a includes a memory cell array 310, an address decoder 340, a page buffer circuit 320, a data input/output circuit 330, a control circuit 350, and a voltage generator 360.

The memory cell array 310 may be coupled to the address decoder 340 through a string selection line SSL, a plurality of word-lines WLs, and a ground selection line GSL. The memory cell array 310 may be coupled to the page buffer circuit 320 through a plurality of bit-lines BLs. The memory cell array 310 may include a plurality of memory cells coupled to the word-lines WLs and the bit-lines BLs.

In some exemplary embodiments, the memory cell array 310 may be a three-dimensional memory cell array, which is formed on a substrate in a three-dimensional structure (or a vertical structure). The memory cell array 310 may include vertical cell strings that are vertically oriented such that at least one memory cell is over another memory cell. The following patent documents, which are hereby incorporated by reference, describe example configurations for three-dimensional memory cell arrays: U.S. Pat. Nos. 7,679,133; 8,553,466; 8,654,587; 8,559,235; and US Pat. Pub. No. 2011/0233648. In one embodiment, the memory cell array 310 may be a two-dimensional memory cell array formed on a substrate in a two-dimensional structure (or a horizontal structure).

Figure 8:
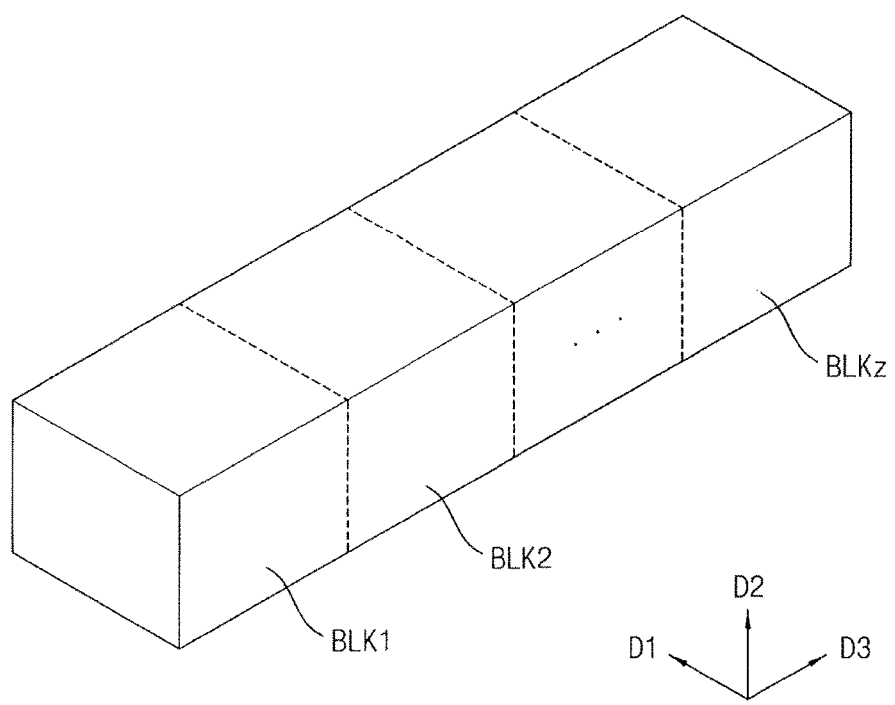
FIG. 8 illustrates an embodiment of a memory cell array.

FIG. 8 illustrates an embodiment of the memory cell array 310 which may include a plurality of memory blocks BLK1 to BLKz which extend in directions D1-D3. In an embodiment, the memory blocks BLK1 to BLKz are selected by the address decoder 340 in FIG. 7. For example, the address decoder 310 may select a memory block BLK corresponding to a block address among the memory blocks BLK1 to BLKz.

Figure 9:
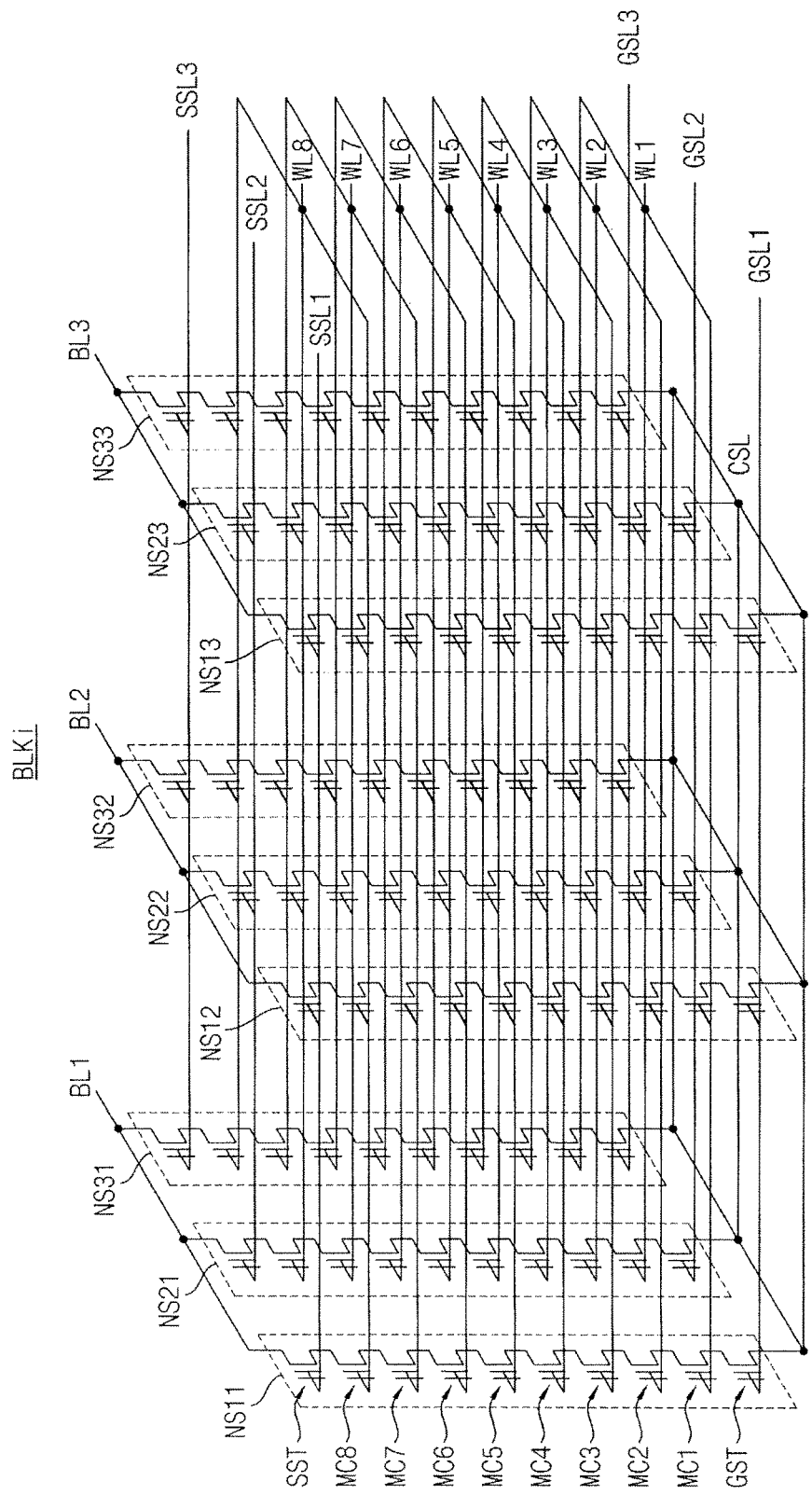
FIG. 9 illustrates an embodiment including a memory block.

FIG. 9 illustrates an embodiment of an equivalent circuit of one of the memory blocks of FIG. 8. The memory block BLKa of FIG. 9 may be on a substrate in a three-dimensional structure (or a vertical structure). For example, a plurality of memory cell strings in the memory block BLKa may be in a direction perpendicular to the substrate.

Referring to FIG. 9, the memory block BLKa may include memory cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC8, and a ground selection transistor GST. In FIG. 9, each of the memory cell strings NS11 to NS33 is illustrated to include eight memory cells MC1 to MC8. In one embodiment, each of the memory cell strings NS11 to NS33 may include a different number of memory cells.

The string selection transistor SST may be connected to corresponding string selection lines SSL1 to SSL3. The memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3. The ground selection transistor GST may be connected to the common source line CSL.

Word-lines (e.g., WL1) having the same height may be commonly connected. The ground selection lines GSL1 to GSL3 and the string selection lines SSL1 to SSL3 may be separated. In FIG. 9, the memory block BLKb is coupled to eight word lines WL1 to WL8 and three bit lines BL1 to BL3, but may be coupled to a different number of word lines and/or bit lines in another embodiment.

Referring back to FIG. 7, the control circuit 350 may receive a command (signal) CMD and an address (signal) ADDR from the first memory controller 200a and control an erase loop, a program loop, and a read operation of the first nonvolatile memory device 300a based on the command signal CMD and the address signal ADDR. The program loop may include, for example, a program operation and a program verification operation. The erase loop may include, for example, an erase operation and an erase verification operation.

For example, the control circuit 350 may generate control signals CTLs for controlling the voltage generator 360, based on the command signal CMD, and may generate a row address R_ADDR and a column address C_ADDR based on the address signal ADDR. The control circuit 350 may provide the row address R_ADDR to the address decoder 340 and provide the column address C_ADDR to the data input/output circuit 330.

The address decoder 340 may be coupled to the memory cell array 310 through the string selection line SSL, the plurality of word-lines WLs, and the ground selection line GSL. During the program operation or the read operation, the address decoder 340 may determine one of the plurality of word-lines WLs as a first word-line (i.e., a selected word-line) and determine rest of the plurality of word-lines WLs except for the first word-line as unselected word-lines based on the row address R_ADDR.

The voltage generator 360 may generate word-line voltages VWLs for operation of the first nonvolatile memory device 300a based on the control signals CTLs. The voltage generator 360 may receive a power PWR from the first memory controller 200a. The word-line voltages VWLs may be applied to the word-lines WLs through the address decoder 340.

For example, during the erase operation, the voltage generator 360 may apply an erase voltage to a well of the memory block and may apply a ground voltage to all of the word-lines of the memory block. During the erase verification operation, the voltage generator 360 may apply an erase verification voltage to all of the word lines of the memory block or sequentially apply the erase verification voltage to word lines in a word line basis.

For example, during the program operation, the voltage generator 360 may apply a program voltage to the first word-line and may apply a program pass voltage to the unselected word-lines. In addition, during the program verification operation, the voltage generator 360 may apply a program verification voltage to the first word line and may apply a verification pass voltage to the unselected word lines.

In addition, during the read operation, the voltage generator 360 may apply a read voltage to the first word line and may apply a read pass voltage to the unselected word lines.

The page buffer circuit 320 may be coupled to the memory cell array 310 through the bit-lines BLs. The page buffer circuit 320 may include a plurality of page buffers. In some exemplary embodiments, one page buffer may be connected to one bit-line. In other exemplary embodiments, one page buffer may be connected to two or more bit-lines. The page buffer circuit 320 may temporarily store data to be programmed in a selected page or data read out from the selected page.

The data input/output circuit 330 may be coupled to the page buffer circuit 320 through data lines DL. During the program operation, the data input/output circuit 330 may receive the first data DTA1 from the first memory controller 200a and provide the first data DTA1 to the page buffer circuit 320 based on the column address C_ADDR from the control circuit 350. During the read operation, the data input/output circuit 330 may provide first data DTA1, which are stored in the page buffer circuit 320, to the first memory controller 200a based on the column address C_ADDR from control circuit 350.

In addition, the page buffer circuit 320 and the data input/output circuit 330 read data from a first area of the memory cell array 310 and write the read data to a second area of the memory cell array 310. For example, the page buffer circuit 320 and the data input/output circuit 330 may perform a copy-back operation.

Figure 10:
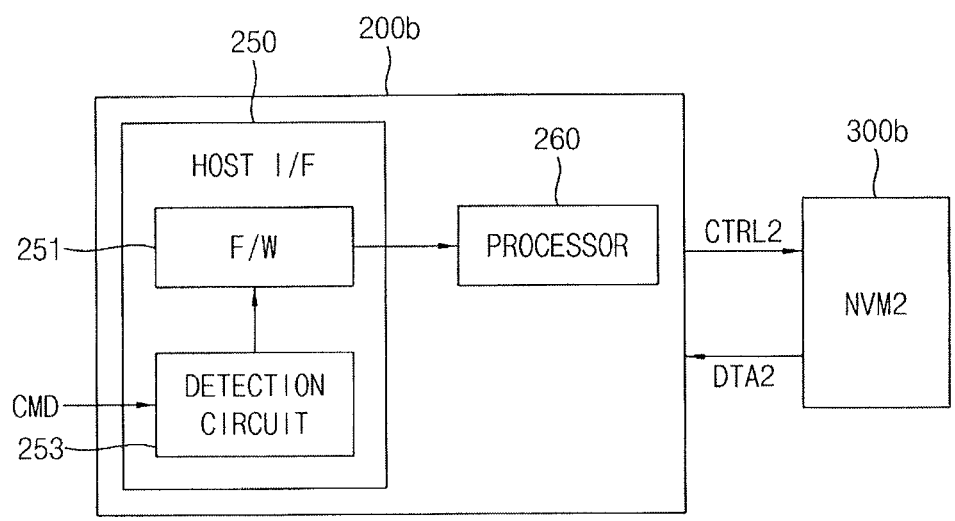
FIG. 10 illustrates an embodiment including a memory controller and a nonvolatile memory device.

FIG. 10 illustrates an embodiment including a second memory controller and the second nonvolatile memory device in the memory card of FIG. 3. Referring to FIG. 10, the second nonvolatile memory device 300b may perform a read, a write, and an erase operation based on a control of the second memory controller 200b. The second memory controller 200b controls the second nonvolatile memory device 300b based on a request of the host device 20. The second memory controller 200b issues a second control signal CTRL2 to the second nonvolatile memory device 300b and exchanges second data DTA2 with the second nonvolatile memory device 300b.

The second memory controller 200b may include a second host interface 250 and a processor 260. The second host interface 250 may manage communications between the second memory controller 200b and the host device 20 in compliance with the second protocol. The second protocol may be an SD protocol.

The second host interface 250 may be connected to the first group of terminals 130 and may include a detection circuit 253 and a firmware 251. The detection circuit 253 detects a command CMD output from the host device 20. The detection circuit 253 may be embodied by a register.

The firmware 251 reads a command stored in the detection circuit 253 and generates a signal corresponding to the read command to the processor 260. The processor 260 may control an overall operation of the first memory controller 200a and may conduct a logical operation.

Figure 11:
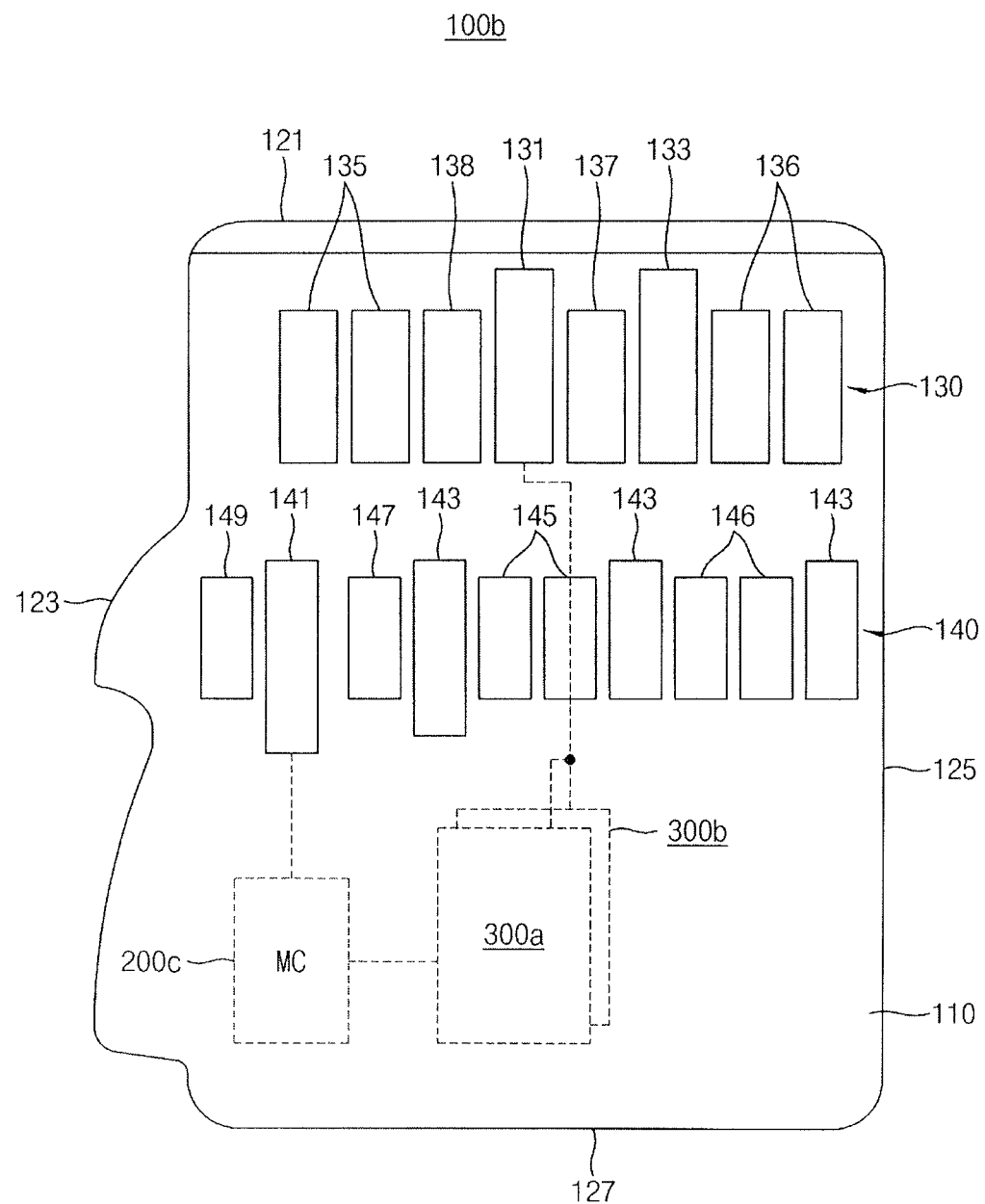
FIG. 11 illustrates another embodiment of a memory card.

FIG. 11 illustrates another embodiment of the memory card 100b and internal components. Referring to FIG. 11, the memory card 100b may include a memory controller 200c, a first nonvolatile memory device 300a and a second nonvolatile memory device 300b. The memory card 100b is different from the memory card 100a of FIG. 3 in that the memory controller 200c replaces the first memory controller 200a and the second memory controller 200b.

The memory controller 200c may be connected to the second power terminal 141 and may be supplied with the second voltage. The memory controller 200c may also be connected to the first nonvolatile memory device 300a and the second nonvolatile memory device 300b.

The memory controller 200c may be connected to the second group of terminals 140 and may communicate with the host device 20 according to the first protocol to access the first nonvolatile memory device 300a. In addition, the memory controller 200c may be connected to the first group of terminals 130 and may communicate with the host device 20 according to a second protocol to access second nonvolatile memory device 300b simultaneously with accessing the first nonvolatile memory device 300a.

Figure 12:
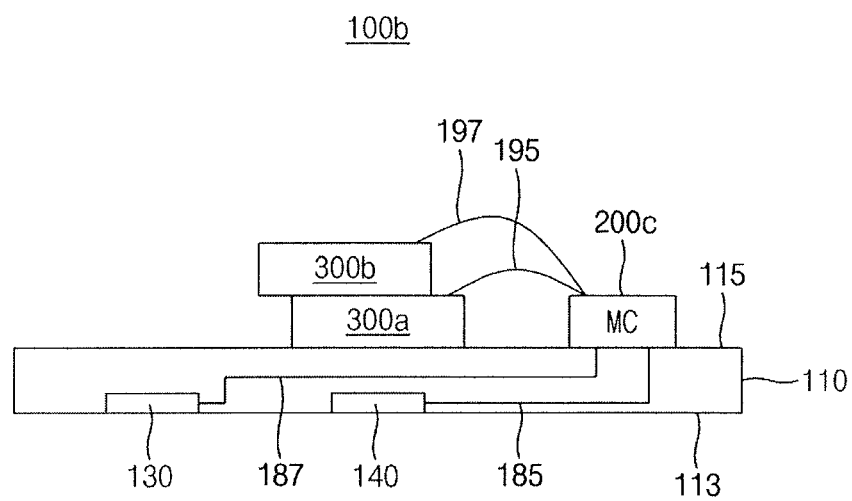
FIG. 12 illustrates another view of the memory card in FIG. 11.

FIG. 12 illustrates an embodiment of a sectional view of the memory card of FIG. 11. Referring to FIG. 12, the first group of terminals 130 and the second group of terminals 140 may be on the first surface 113 of the substrate 110. In addition, the memory controller 200c, the first nonvolatile memory device 300a, and the second nonvolatile memory device 300b may be on the second surface 115 of the substrate 110, which is opposite to the first surface 113.

The memory controller 200c may be electrically connected to the second group of terminals 140 via a wire 185, and may be electrically connected to the first group of terminals 130 via a wire 187. In addition, the memory controller 200c may be electrically connected to the first nonvolatile memory device 300a via a wire 195, and may be electrically connected to second nonvolatile memory device 300b via a wire 197.

Figure 13:
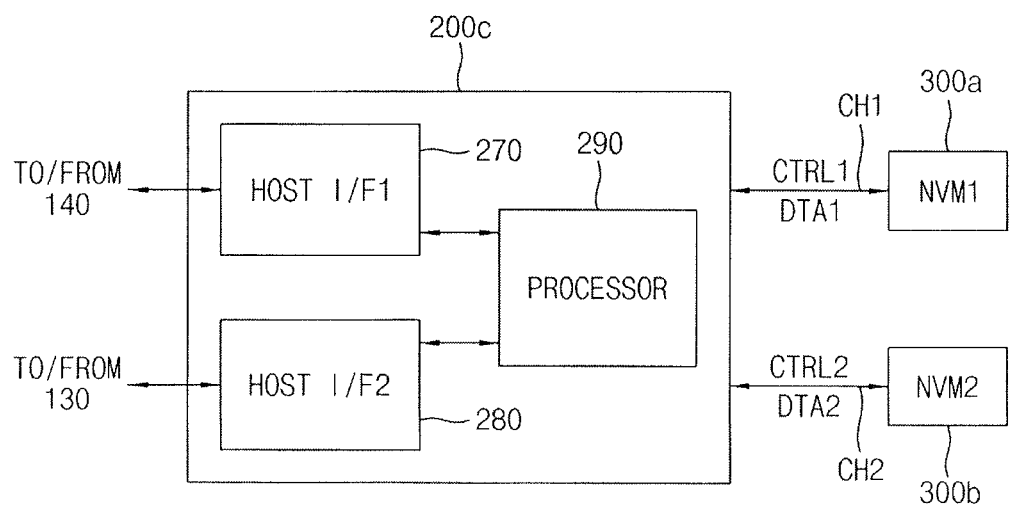
FIG. 13 illustrates an embodiment including a memory controller and a plurality of nonvolatile memory devices.

FIG. 13 illustrates an embodiment including the memory controller, the first nonvolatile memory device, and the second nonvolatile memory device in the memory card of FIG. 11. Referring to FIG. 13, the memory controller 200c is connected to the first nonvolatile memory device 300a via a first channel CH1, issues a first control signal CTRL1 to the first nonvolatile memory device 300a, and exchanges first data DTA1 with the first nonvolatile memory device 300a via the first channel CH1. The memory controller 200c is connected to the second nonvolatile memory device 300b via a second channel CH2, issues a second control signal CTRL2 to the second nonvolatile memory device 300b, and exchanges second data DTA2 with the second nonvolatile memory device 300b via the second channel CH2.

The memory controller 200c includes a first host interface 270, a second host interface 280, and a processor 290. The first host interface 270 may manage communications between the memory controller 200c and the host device 20 in compliance with the UFS protocol. The second host interface 280 may manage communications between the memory controller 200c and the host device 20 in compliance with the SD protocol. The first host interface 270 may be connected to the second group of terminals 140 and the second host interface 280 may be connected to the first group of terminals 130.

The processor 290 may control an overall operation of the memory controller 200c and may conduct a logical operation.

Figure 14:
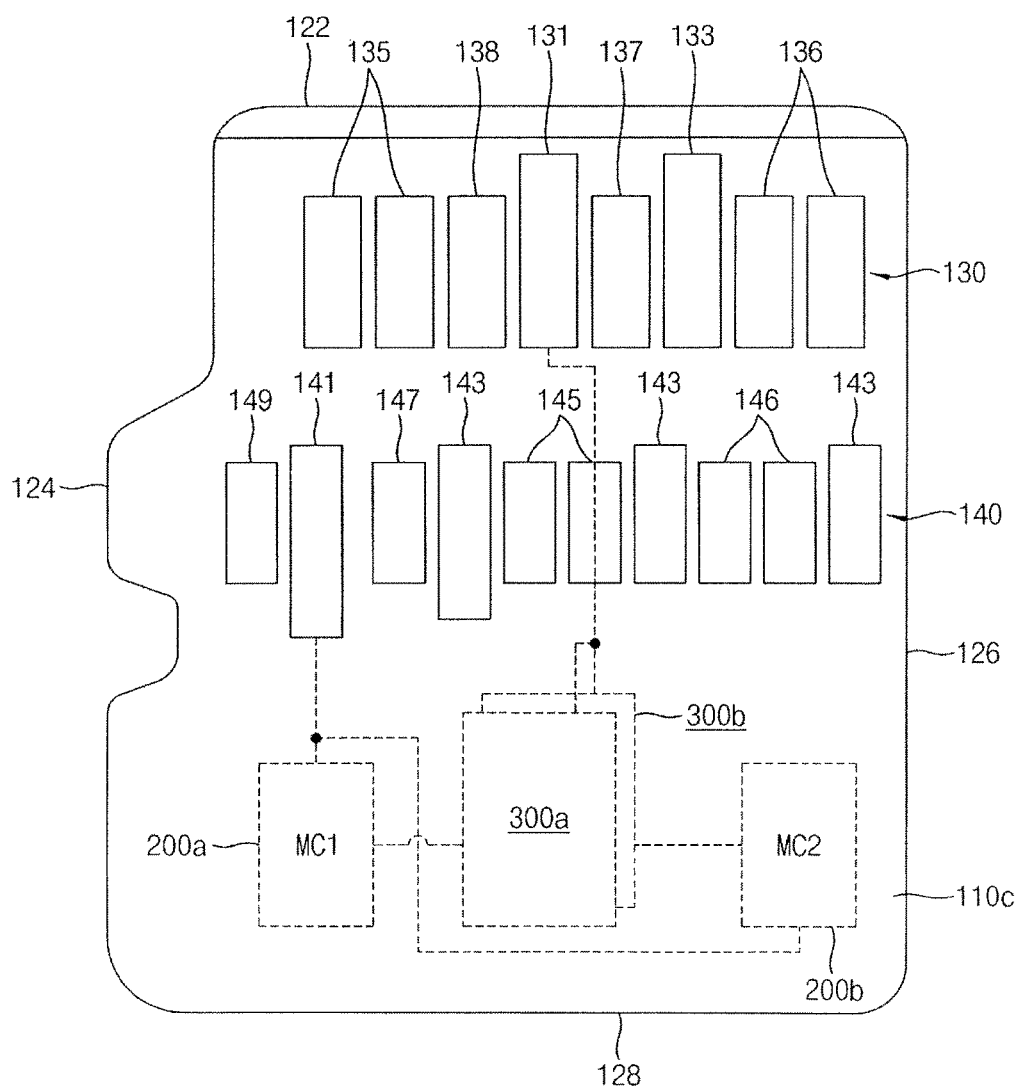
FIG. 14 illustrates an embodiment of a memory card.

FIG. 14 illustrates another embodiment of the memory card 100c and internal components in FIG. 1. Referring to FIG. 14, a memory card 100c may have two pairs of edges, in which the edges of each pair are arranged opposite to each other. The edges may include an edge 122 (e.g., an insertion edge) at an insertion side where the memory card 100c is inserted into a socket, a first edge 124 and a second edge 126 that adjoin the edge 122 at the insertion side, and a third edge 128 opposite the edge 122 at the insertion side. The insertion edge 122 and the third edge 128 may therefore provide one of the two pairs of edges, and the first edge 124 and second edge 126 may form the other. The edge 122 at the insertion side and third edge 128 may be substantially parallel to each other.

In addition, a substrate 110c of the memory card 100c may include a first group of terminals 130 adjacent to the insertion edge 122 and a second group of terminals 140 spaced apart from the first group of terminals 130 farther from the insertion edge 122.

The memory card 100c may include a first memory controller 200a, a second memory controller 200b, a first nonvolatile memory device 300a, and a second nonvolatile memory device 300b which are on a second surface of the substrate 110c. The second surface is opposite to a first surface of the substrate 110c, on which the first group of terminals 130 and the second group of terminals 140 are disposed. The memory card 100c of FIG. 14 may be substantially the same as the memory card 100a in FIG. 3, except for the shape of substrate 100c. The substrate 110c of the memory card 100c may have a shape corresponding, for example, to an SD memory card standard.

Figure 15:
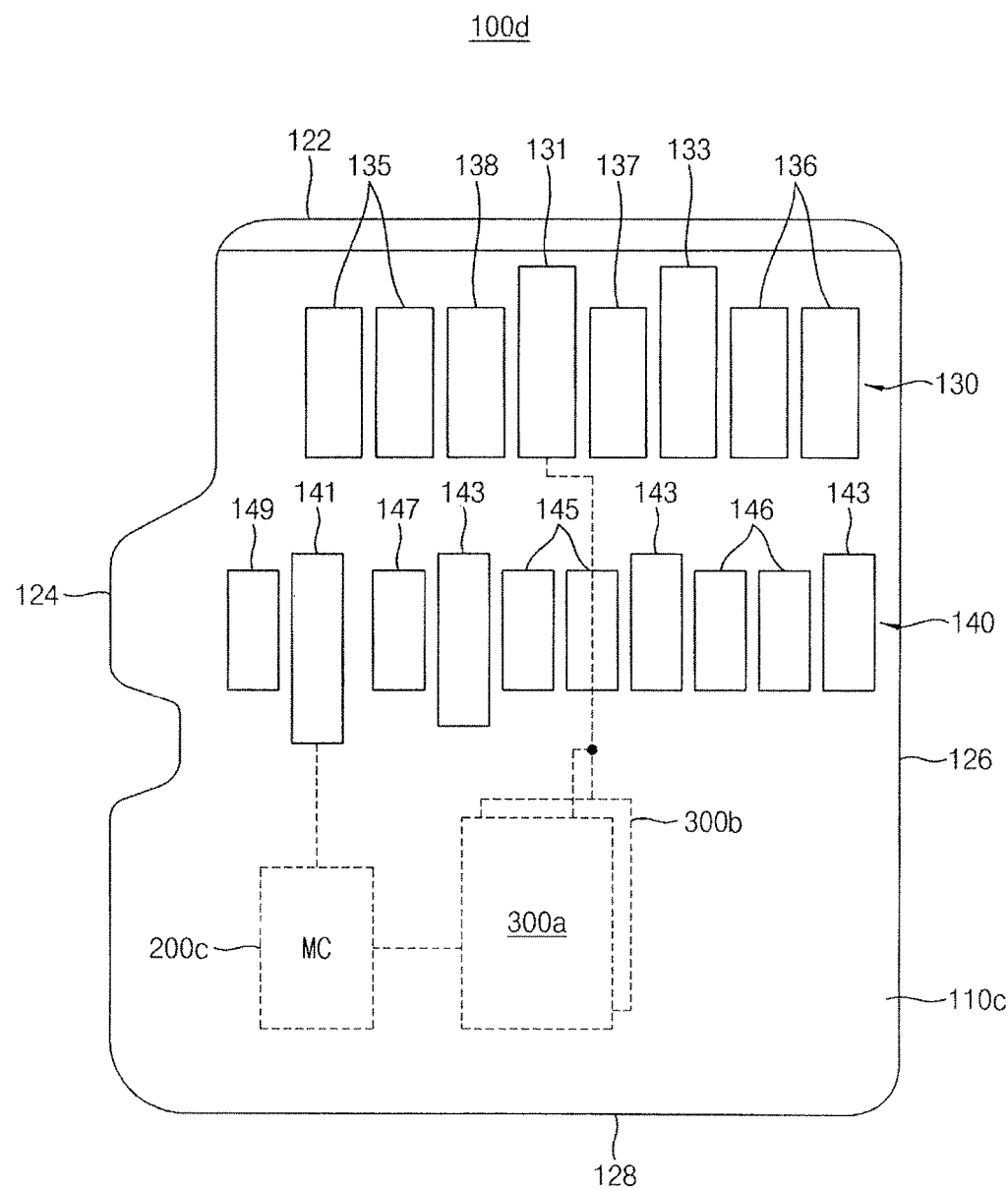
FIG. 15 illustrates an embodiment of a memory card.

FIG. 15 illustrates another embodiment of the memory card 100d and internal components in FIG. 1. Referring to FIG. 15, a memory card 100d may include a memory controller 200d, a first nonvolatile memory device 300a, and a second nonvolatile memory device 300b. The memory card 100d is different from the memory card 100c of FIG. 14, in that the memory controller 200d replaces the first memory controller 200a and the second memory controller 200b.

Figure 16:
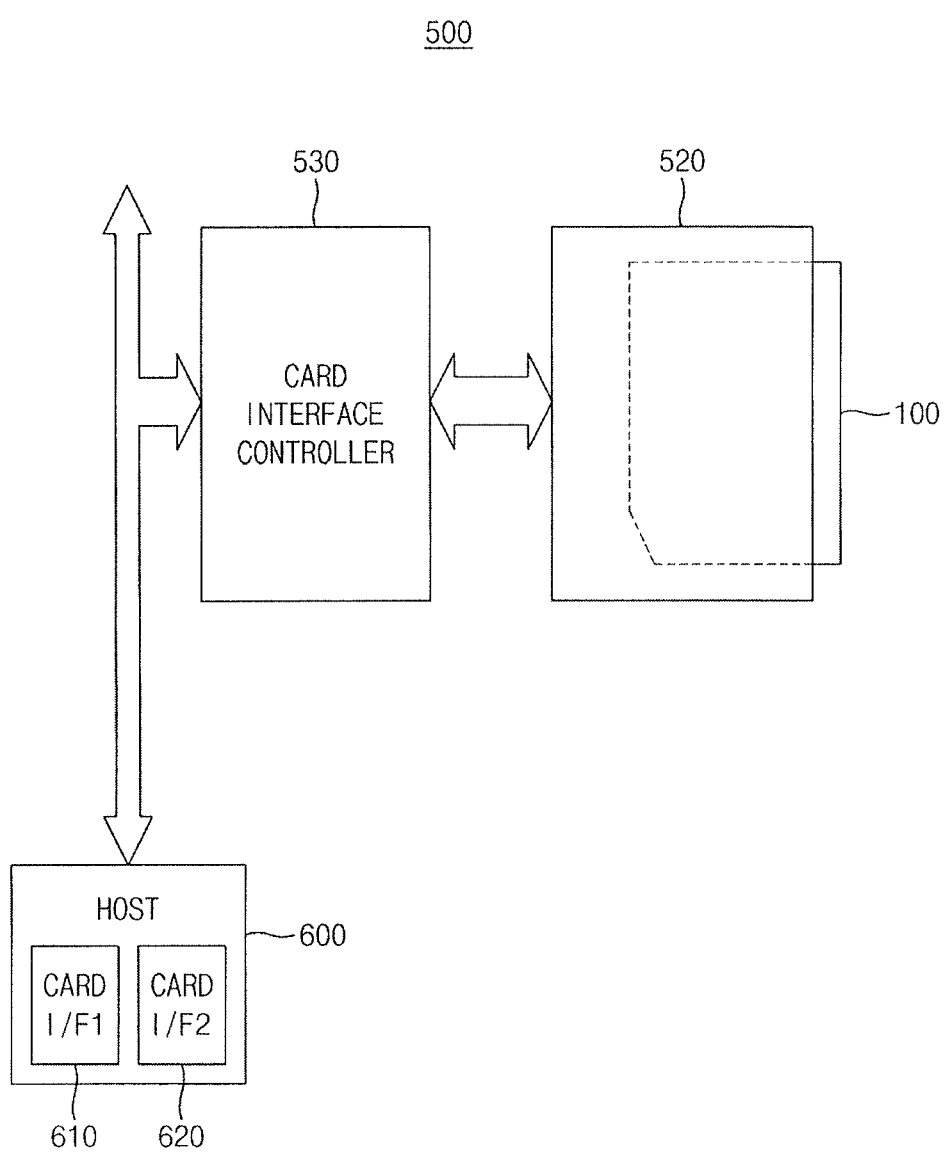
FIG. 16 illustrates an embodiment of a system including a memory card.

FIG. 16 illustrates an embodiment of a system 500 employing one or more memory cards according any or a combination of the aforementioned embodiments. Referring to FIG. 16, the system 500 includes a socket 520, the memory card 100 which represents one of the memory cards 100a, 100b. 100c and 100d described above, a card interface controller 530, and a host device 600. The memory card 100 may be insertable into and contact the socket 520. The socket 520 may be electrically connected to the first group of terminals 130 and the second group of terminals 140 of the memory card 100. The card interface controller 530 may control data exchange with the memory card 100 via the socket 520. The card interface controller 530 may also be used to store data in the memory card 100. The host device 600 may control the card interface controller 530.

The host device 600 may support various card interfaces. The host device 600 may include at least a first card interface 610 and a second card interface 620. The first card interface 610 is connected to the memory card 100 via the socket 520 and the card interface controller 530 and communicates with the memory card 100 according to a second protocol. The second card interface 620 is connected to the memory card 100 via the socket 520 and the card interface controller 530 and communicates with the memory card 100 according to a first protocol. Therefore, the host device 600 may communicate with the memory card 100 according to the first and second protocols simultaneously. In one embodiment, the first card interface 610 may be an SD card interface and the second card interface 620 may be a UFS card interface.

Figure 17:
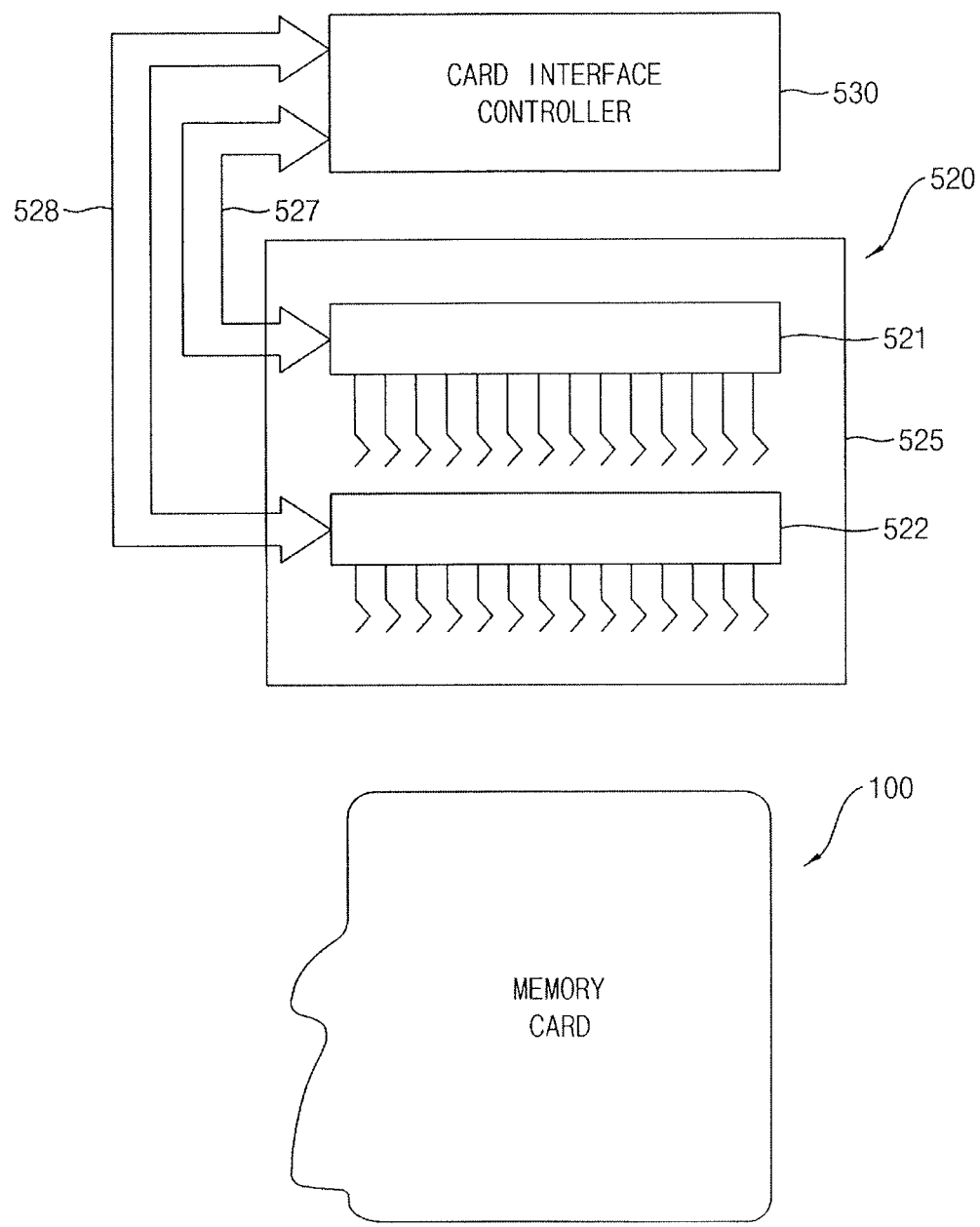
FIG. 17 illustrates an embodiment of a socket.

FIG. 17 illustrates an embodiment of the socket 520 into which the memory card 100 is to be inserted. The socket 520 may include a first group of socket pins 521 corresponding to the first group of terminals 130 of the memory card 100, and a second group of socket pins 522 corresponding to the second group of terminals 140 of the memory card 100 or 200. The socket 520 may also include a housing 525 to accommodate the first group of socket pins 521 and the second group of socket pins 522. The memory card 100 may operate by being inserted into the housing 525 to contact the first group of socket pins 521 and the second group of socket pins 522.

As described with reference to FIG. 16, the socket 520 may be electrically connected to the card interface controller 530 which inputs or outputs power, a signal, and/or data to the first group of socket pins 521 and the group of socket pins 522. The first group of socket pins 521 may be connected to the card interface controller 530 via a first channel 527. The second group of socket pins 522 may be connected to the card interface controller 530 via a second channel 528.

A socket pin may exist, among the first group of socket pins 521 and the second group of socket pins 522, to allow for recognition of the type of inserted memory card 100 based on a predetermined terminal corresponding to the memory card 100.

Figure 18:
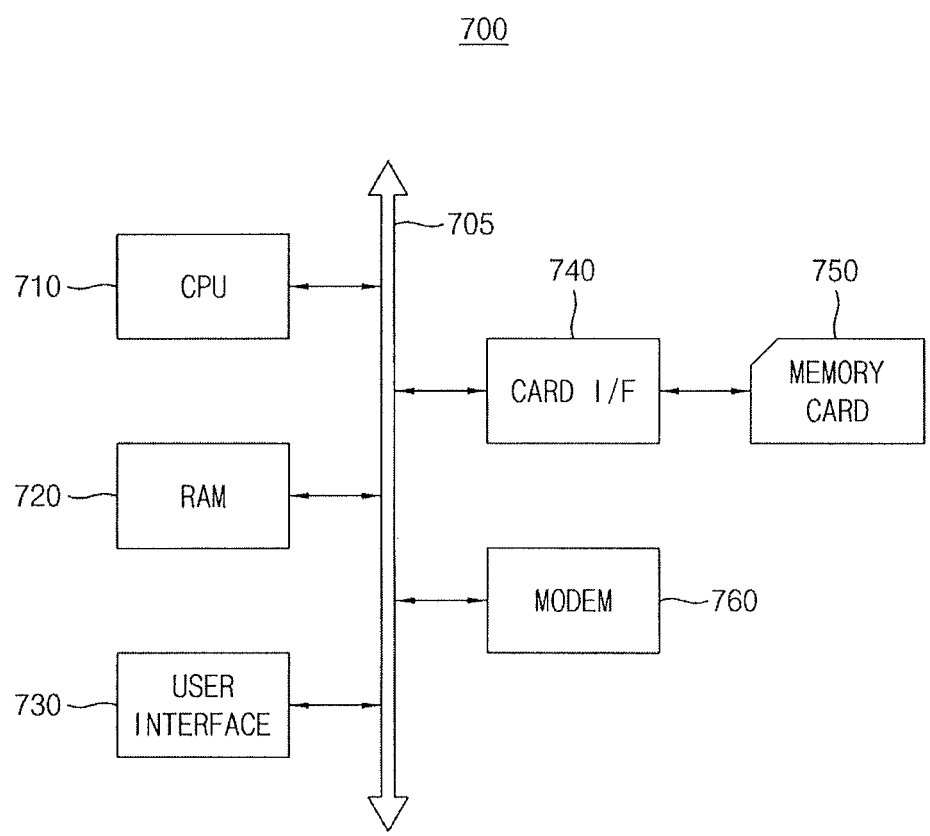
FIG. 18 illustrates an embodiment of a computing system.

FIG. 18 illustrates an embodiment of a computing system 700 employing one or more of the aforementioned embodiments of the memory card. Referring to FIG. 18, a computing system 700 includes a CPU (or, a microprocessor) 710, a RAM 720, a user interface 730, a modem 760, such as a baseband chipset, a card interface 740, and a memory card 750. The elements 710, 720, 730, 740, and 760 are electrically connected with a system bus 705. The card interface 740 and a memory card 750 may form a storage device. The memory card 750 may employ one of the memory cards 100a, 100b. 100c, and 100d and the card interface 740 may include at least a first card interface and a second card interface as described with reference to FIG. 17. When the memory card 750 is inserted into the card interface 740 and memory card 750 is electrically connected to the CPU 710, CPU 710 may recognize memory card 750 as two different memory cards.

When the computing system 700 is a mobile device, a battery may power the computing system 700. In one embodiment, the computing system 700 may include an application chipset, a camera image processor (CIS), and/or a mobile DRAM.

In accordance with one or more of the aforementioned embodiments, a storage device or storage system device may be packaged using various package types or package configurations. The embodiments described herein may be applied to various electronic devices that include or are coupled to a memory card. Examples include a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The processors, decoders, selectors, control units, interfaces, and other signal processing or signal controlling features of the disclosed embodiments may be implemented in logic which, for example, may include hardware, software, or both. When implemented at least partially in hardware, the processors, decoders, selectors, control units, interfaces, and other signal processing or signal controlling features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the processors, decoders, selectors, control units, interfaces, and other signal processing or signal controlling features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A memory card, comprising:
a substrate including two pairs of edges, the edges in each pair arranged opposite to each other;
a first group of terminals adjacent to an edge at an insertion side of the substrate, the first group of terminals including a first power terminal to provide a first voltage;
a second group of terminals spaced farther apart from the edge at the insertion side than the first group of terminals, the second group of terminals including a second power terminal to provide a second voltage;
at least one memory controller connected to the first group of terminals and the second group of terminals, the at least one memory controller including a first host interface to communicate with an external host according to a first protocol and a second host interface to communicate with the external host according to a second protocol different from the first protocol;
at least a first nonvolatile memory connected to the at least one memory controller; and
at least a second nonvolatile memory connected to the at least one memory controller independently from the first nonvolatile memory, wherein
the at least one memory controller provides the external host with simultaneous accesses to the first nonvolatile memory and the second nonvolatile memory through the first and second host interfaces, respectively, when the first group of terminals and the second group of terminals are connected to the external host.

2. The memory card as claimed in claim 1, wherein:
the first group of terminals and the second group of terminals are in a first surface of the substrate,
the at least one memory controller, the first nonvolatile memory, and the second nonvolatile memory are in a second surface of the substrate, and
the first surface is opposite to the second surface.

3. The memory card as claimed in claim 1, wherein the at least one memory controller includes:
a first memory controller connected to the second power terminal and the first nonvolatile memory; and
a second memory controller connected to the second power terminal and the second nonvolatile memory, wherein the first nonvolatile memory and the second nonvolatile memory are connected to the first power terminal.

4. The memory card as claimed in claim 3, wherein:
the first memory controller includes the first host interface to perform communication with the external host according to the first protocol,
the second memory controller includes the second host interface to perform communication with the external host according to the second protocol different from the first protocol, and
the first host interface and the second host interface are to communicate simultaneously with the external host.

5. The memory card as claimed in claim 4, wherein:
the first protocol is a Universal Flash Storage (UFS) protocol, and
the second protocol is a Secure Digital (SD) protocol.

6. The memory card as claimed in claim 1, wherein the at least one memory controller includes a memory controller connected to the second power terminal, the first nonvolatile memory, and the second nonvolatile memory.

7. The memory card as claimed in claim 6, wherein:
the first protocol is a Universal Flash Storage (UFS) protocol, and
the second protocol is a Secure Digital (SD) protocol.

8. The memory card as claimed in claim 1, wherein the first nonvolatile memory and the second nonvolatile memory are a same kind of nonvolatile memory.

9. The memory card as claimed in claim 1, wherein the first nonvolatile memory and the second nonvolatile memory are different kinds of nonvolatile memories.

10. The memory card as claimed in claim 1, wherein:
the first group of terminals includes a pair of first data input terminals and a pair of first data output terminals,
the second group of terminals includes a pair of second data input terminals and a pair of second data output terminals,
the pair of first data input terminals are to provide a first input data to the second nonvolatile memory and the pair of first data output terminals are to provide a first output data from the second nonvolatile memory to a predetermined destination, and
the pair of second data input terminals is to provide a second input data to the first nonvolatile memory and the pair of second data output terminals is to provide a second output data from the first nonvolatile memory to the predetermined destination.

11. The memory card as claimed in claim 10, wherein:
the first data input terminals and the first data output terminals are spaced apart from each other, with a first ground terminal therebetween, and
the second data input terminals and the second data output terminals are spaced apart from each other, with a second ground terminal therebetween.

12. The memory card as claimed in claim 1, wherein the substrate has a shape according to a Universal Flash Storage (UFS) memory card standard, or a shape according to a Secure Digital (SD) memory card standard.

13. A storage system, comprising:
a host;
a socket electrically connected to the host; and
a memory card to be inserted into the socket and including:
a substrate having two pairs of edges, the edges in each pair are arranged opposite to each other;
a first group of terminals adjacent to an edge at an insertion side of the substrate, the first group of terminals including a first power terminal to provide a first voltage;
a second group of terminals spaced farther apart from the edge at the insertion side than the first group of terminals, the second group of terminals including a second power terminal to provide a second voltage;
at least one memory controller connected to the first group of terminals and the second group of terminals, the at least one memory controller including a first host interface to communicate with the host according to a first protocol and a second host interface to communicate with the host according to a second protocol different from the first protocol;
at least a first nonvolatile memory connected to the at least one memory controller; and
at least a second nonvolatile memory connected to the at least one memory controller independently from the first nonvolatile memory, wherein the at least one memory controller provides the host with simultaneous accesses to the first nonvolatile memory and the second nonvolatile memory through the first and second host interfaces, respectively, when the first group of terminals and the second group of terminals are connected to the host.

14. The storage system as claimed in claim 13, wherein the host is to identify the memory card as two different cards.

15. The storage system as claimed in claim 13, wherein:
the socket includes a first group of socket pins connected to the first group of terminals and a second group of socket pins connected to the first group of terminals, and
the host includes:
a first card interface to communicate with the at least one memory controller according to the second protocol via the first group of socket pins; and
a second card interface to communicate with the at least one memory controller according to the first protocol different from the second protocol via the second group of socket pins,
the first card interface is a Secure Digital (SD) card interface,
the second card interface is a Universal Flash Storage (UFS) card interface, and
the host is to recognize the memory card as a respective UFS card and a respective SD card.

16. A memory card, comprising:
a plurality of connections; and
at least one controller including a first host interface to communicate with a host according to a first protocol and a second host interface to communicate with the host according to a second protocol different from the first protocol, the at least one controller to provide the host with simultaneous accesses to a first nonvolatile memory and a second nonvolatile memory through the first and second host interfaces, respectively, when first terminals and second terminals on the memory card are coupled to the host, wherein the first nonvolatile memory and the second nonvolatile memory are independently coupled to the at least one controller through the connections.

17. The memory card as claimed in claim 16, wherein:
the first terminals are adjacent to an edge at an insertion side of the memory card, the first terminals including a first power terminal to provide a first voltage, and
the second terminals are spaced farther apart from the edge at the insertion side than the first terminals, the second terminals including a second power terminal to provide a second voltage.

18. The memory card as claimed in claim 17, wherein the at least one controller includes:
a first memory controller coupled to the second power terminal and the first nonvolatile memory; and
a second memory controller coupled to the second power terminal and the second nonvolatile memory, wherein the first nonvolatile memory and the second nonvolatile memory are coupled to the first power terminal.

19. The memory card as claimed in claim 18, wherein:
the first protocol is a Universal Flash Storage (UFS) protocol, and
the second protocol is a Secure Digital (SD) protocol.

* * * * *